United States Patent [19]
Kimata

[11] Patent Number: 4,760,273
[45] Date of Patent: Jul. 26, 1988

[54] SOLID-STATE IMAGE SENSOR WITH GROOVE-SITUATED TRANSFER ELEMENTS

[75] Inventor: Masafumi Kimata, Hyogo, Japan

[73] Assignee: Mitsubishi Denki Kabushiki Kaisha, Tokyo, Japan

[21] Appl. No.: 46,786

[22] Filed: May 7, 1987

[30] Foreign Application Priority Data

May 13, 1986 [JP] Japan .................. 61-111311

[51] Int. Cl.[4] .................. H01J 40/14; H01L 29/78
[52] U.S. Cl. .................. 250/578; 357/24
[58] Field of Search ........ 250/578; 357/24 R, 24 LR, 357/15; 358/213.11

[56] References Cited

U.S. PATENT DOCUMENTS

| | | | |
|---|---|---|---|
| 3,890,633 | 6/1975 | Kosonocky | 357/24 |
| 4,156,247 | 5/1979 | Hartman et al. | 357/24 |
| 4,581,539 | 4/1986 | Kimata | 250/578 |
| 4,586,084 | 4/1986 | Imai | 357/24 LR |
| 4,644,402 | 2/1987 | Yamada | 358/213.11 |

FOREIGN PATENT DOCUMENTS

1310868 3/1973 United Kingdom .

OTHER PUBLICATIONS

*ISSCC*, Feb. 13, 1985, "A 480×400 Element Image Sensor with a Charge Sweep Device", by Masafumi Kimata et al., pp. 100–101.

*JAP. Journal of Appl. Phys.*, vol. 21, 1982, pp. 231–235, "Platinum Silicide Schottky-Barrier IR-CCD Image Sensors", by Masafumi Kimata et al.

*Primary Examiner*—David C. Nelms
*Assistant Examiner*—Khaled Shami
*Attorney, Agent, or Firm*—Lowe, Price, LeBlanc, Becker & Shur

[57] ABSTRACT

Grooves 8a are formed on a main surface of a semiconductor substrate 8 and a vertical charge transfer element is formed on a side wall of each groove 8a. As a result, the areas occupied by the vertical charge transfer elements on the main surface of the semiconductor substrate 8 are substantially zero, whereby the areas occupied by Schottky barrier photo sensors 1 can be increased.

6 Claims, 5 Drawing Sheets

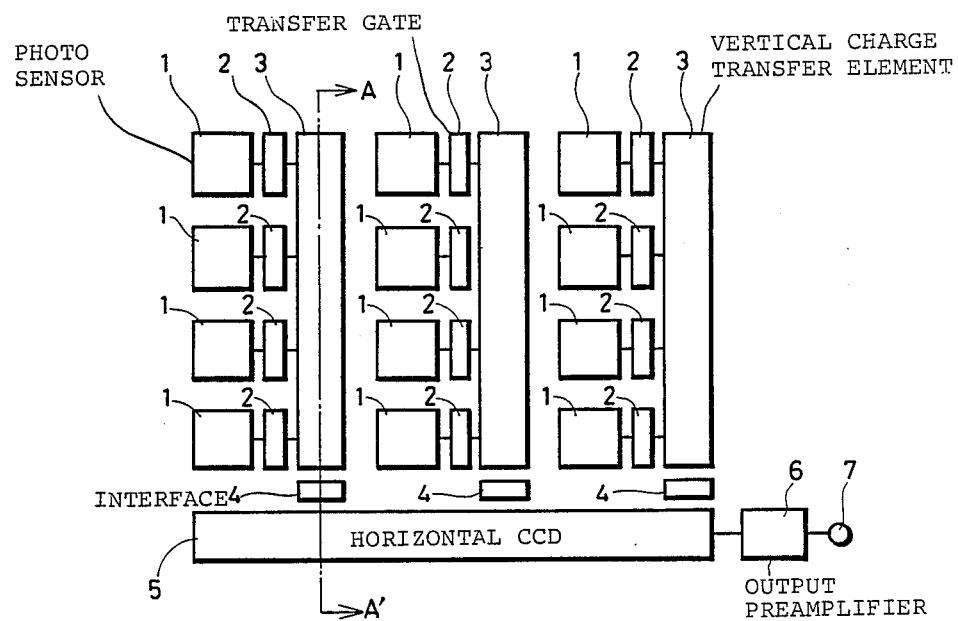

SOLID-STATE IMAGE SENSOR WITH GROOVE-SITUATED TRANSFER ELEMENTS

BACKGROUND OF THE INVENTION

1. Field of the Invention

The present invention relates to a solid-state image sensor and particularly to a solid-state image sensor with a charge sweep device (referred to hereinafter as CSD) using Schottky barrier photo sensors.

2. Description of the Prior Art

Among solid-state image sensors, there is known a sensor using a charge sweep device (CSD) for vertical transfer of charge. Such a solid-state image sensor with CSD is described in Technical Digest of ISSCC 85, pp. 100–101 by M. Kimata et al. A solid-state image sensor using a Schottky barrier is described for example by M. Kimata et al. in Japanese Journal of Applied Physics, Vol. 21 (1982), Supplement 21-1, pp. 231–235.

FIG. 1 is a plan view showing an array of a conventional solid-state image sensor with CSD, particularly disclosed in Japanese Patent Laying-Open Gazette No. 68969/1984 (counterpart U.S. Pat. No. 4,581,539). FIG. 1 shows an array of 3 columns×4 rows for simplification. In this figure, photo sensors 1 are arrayed in a matrix on a semiconductor substrate. The photo sensors 1 store electric charge according to an amount of received light. A transfer gate 2 is provided for each photo sensor 1 on the semiconductor substrate. The transfer gate 2 controls reading of the charge stored in the associated photo sensor 1. Vertical charge transfer elements 3 are formed on the semiconductor substrate along the column direction of the photo sensors 1. Further, a horizontal charge coupled device (CCD) 5 and interface portions 4 serving as interface between the horizontal CCD 5 and the respective vertical charge transfer elements 3 are formed on the semiconductor substrate. The horizontal CCD 5 is connected with an output preamplifier 6. An output end of the output preamplifier 6 is connected to an output terminal 7.

The horizontal CCD 5 and the output preamplifier 6 in the solid-state image sensor thus constructed may be entirely the same as those in the conventional solid-state image senso of the CCD system. A characteristic feature of the solid-state image sensor shown in FIG. 1 resides in portions related with transfer of charge in the vertical direction, namely, the vertical charge transfer elements 3 and the interface portions 4. Therefore, structure and operation of these portions will be described in the following with reference to FIGS. 2A, 2B and 3.

FIG. 2A is a sectional view taken along the line A–A' in FIG. 1. As shown in FIG. 1, a vertical charge transfer element 3 comprises a layer of high resistance, e.g. a gate electrode 31 formed of polysilicon doped with a small amount of As, and wires $3a$ to $3d$ for applying potential to the gate electrode 31. An interface portion 4 comprises two gate electrodes 41 and 42 and an end of the interface portion 4 contacts a gate electrode 51 of the horizontal CCD 5. A channel for transfer of charge is formed under each gate electrode in the semiconductor substrate 8. Those channels may be surface channels or buried channels.

Clock signals $\phi v1$ to $\phi v4$, $\phi s$ and $\phi t$ as shown in FIG. 3 are applied to the gate electrodes 31, 41 and 42, respectively. A clock signal $\phi h$ is applied to the gate electrode 51. The clock signals $\phi v1$ to $\phi v4$ are applied to the wires $3a$ to $3d$, respectively. Although the conventional example is assumed to use N channels, P channels may be used by reversing the polarities of the clock signals.

Now, vertical transfer of charge in the portion shown in FIG. 2A will be described with reference to (a) to (i) of FIG. 2B as well as FIG. 3. The states (a) to (i) of FIG. 2B represent potential states of the channels corresponding to the positions shown in FIG. 2A at timing t1 to timing t9, respectively.

The state (a) of FIG. 2B is a potential state corresponding to the timing t1 shown in FIG. 3. In this state, the clock signals $\phi v1$ to $\phi v4$ are all at a high level and accordingly a large potential well is formed under the gate electrode 31. The clock signal $\phi s$ is at a level higher than that of the clock signals $\phi v1$ to $\phi v4$ and consequently a deeper potential well is formed under the gate electrode 41. In addition, the clock signal $\phi t$ is at a low level and accordingly a shallow potential barrier is formed under the gate electrode 42. On the other hand, the horizontal CCD 5 performs transfer of the charge in this state and changes repeatedly between the potentials as shown by the dotted lines in the FIGURE. When any transfer gate 2 in the vertical direction, namely, in the column direction is conducted to read out the content of the photo sensor 1 onto the vertical charge transfer element 3, it follows that the signal charge Qsig exists in a prescribed position of the gate electrode 31.

Then, if the clock signal $\phi v1$ is changed to the low level at the timing t2 shown in FIG. 3, the potential well under the wire $3a$ becomes shallow and has an inclination from a portion under the wire $3a$ to a portion under the wire $3b$ as shown in (b) of FIG. 2B. As a result, the signal charge Qsig extends in space and is pushed toward the direction of the arrow X shown in FIG. 2B.

Subsequently, if the clock signals $\phi v2$ to $\phi v4$ are successively changed to the low level at t3, t4 and t5 as shown in FIG. 3, the potentials under the wires $3b$ to $3d$ are successively changed to the low level as shown in (c) to (e) of FIG. 2B and, accordingly, the potentials under the gate electrode 31 successively become shallow, whereby the inclined portion moves in the direction of the arrow X. Thus, the signal charge Qsig is forced to move toward the direction of the arrow X and when the clock signal $\phi v4$ falls to the low level, the signal charge Qsig is stored in the potential well under the gate electrode 41. A current value in the wires (for example, a value of current flowing in the wires $3a$ and $3b$ when the wire $3a$ is at the high level and the wire $3b$ is at the low level) is determined by the resistance values of the gate electrodes and consumption of electric power depends on the current value. Therefore, the resistance values of the gate electrodes are desirably large values. However, if the resistance values are too large, a potential inclination between the wires $3a$ and $3b$ cannot be formed in a good condition when the wire $3b$ for example changes from the high level to the low level. Accordingly, the resistance value of the gate electrode 31 is preferably 1MΩ/☐ to 1GΩ/☐ (Ω/☐ being a unit of sheet resistance). This value can be obtained if polysilicon for example is formed by a CVD method and is doped with a small amount of arsenic. The gate electrode 41 needs to be sufficiently large for storing the signal charge Qsig, while the potential at the high level of the clock signal $\phi s$ does not need to be deeper than the potential under the wires $3a$ to $3d$ and may be of the same depth as this potential.

Thus, the signal charge Qsig is collected to the gate electrode 41. After scanning for one horizontal line of the horizontal CCD 5, the clock signal φh of the gate electrode 51 of the horizontal CCD 5 in contact with the gate electrode 42 is changed to the high level and the clock signal φt of the gate electrode 42 is also changed to the high level. As a result, the potentials under the respective gate electrodes become as shown in (f) of FIG. 2B. At this time, the potential under the gate electrode 42 is higher than the potential under the gate electrodes 41 and 51. However, it does not need to be higher than the potential under the gate electrodes 41 and 51 and it may be equal thereto.

Subsequently, at the timing t7 shown in FIG. 3, the clock signal φs is changed to the low level and as shown in (g) of FIG. 2B, the potential under the gate electrode 41 becomes shallow. As a result, the signal charge Qsig is moved into the potential well under the gate electrode 51.

After that, at the timing t8 shown in FIG. 3, the clock signal φt is changed to the low level and as shown in (h) of FIG. 2B, the potential under the gate electrode 42 becomes shallow so that the signal charge Qsig is transferred by the horizontal CCD 5. Thus, the horizontal CCD 5 receiving the signal (the signal charge Qsig) successively transfers the signal to the output preamplifier 6.

When the signal is transferred by the CCD 5 as described above, the clock signals φv1 to φv4 and φs are changed again to the high level at the timing t9 shown in FIG. 3 so that the same condition as in the case of the timing t1 is established. Subsequently, the above described sequential cycle is repeated.

Although the above description of the operation of the conventional example is related with reading out of the contents of the photo sensors 1 associated with one vertical charge transfer elements 3, the other vertical charge transfer elements 3 perform simultaneously the same operation as described above. More specifically, the transfer gates 2 are simultaneously selected for each row to read the charge stored in the photo sensor 1 concerned, whereby each vertical charge transfer element 3 transfers the charge simultaneously in the column direction.

Since the photo sensors 1, the vertical charge transfer elements 3 and the transfer gates 2 are formed on the same plane of the semiconductor substrate 8 in the conventional solid-state image sensor with CSD, the conventional image sensor involves a problem that the fill factor (a proportion of the areas of the photo sensors to the areas of picture elements) is still limited by the isolation of the devices, the transfer gates and the CSD channels even if the adoption of the CSD system makes it possible to decrease the channel width of each vertical charge transfer element to a limit value in photolithography. In addition, practically, the width of the CSD channel is limited by a so-called narrow channel effect (a phenomenon in which according to decrease of a channel width, horizontal diffusion of impurity from the adjacent impurity region occurs conspicuously to cause a change in the characteristics of the channel). Therefore, it is practically impossible to reduce the channel width to a limit value in photolithography and an opening proportion larger than a certain value can not be obtained.

SUMMARY OF THE INVENTION

The present invention has been accomplished to overcome the above-described disadvantages and it is an object of the present invention to provide a solid-state image sensor in which the areas occupied by the portions other than the photo sensors on the surface of a semiconductor substrate are considerably decreased in the design of picture elements, which makes it possible to improve a fill factor (a proportion of the areas of the photo sensors to the areas of the picture elements).

Briefly stated, in the present invention, grooves are formed on a semiconductor substrate and vertical charge transfer elements are formed in side walls of the grooves.

According to the present invention, the areas occupied by the vertical charge transfer elements on the plane surface of the semiconductor substrate become substantially zero. Consequently, a spacing between the respective sensitive portions of the picture elements can be decreased to a width of each of the above-mentioned grooves and thus a solid-state image sensor having a large opening proportion can be obtained.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing an array of a conventional solid-state image sensor with CSD.

DESCRIPTION OF THE PREFERRED EMBODIMENTS

Figure 4:
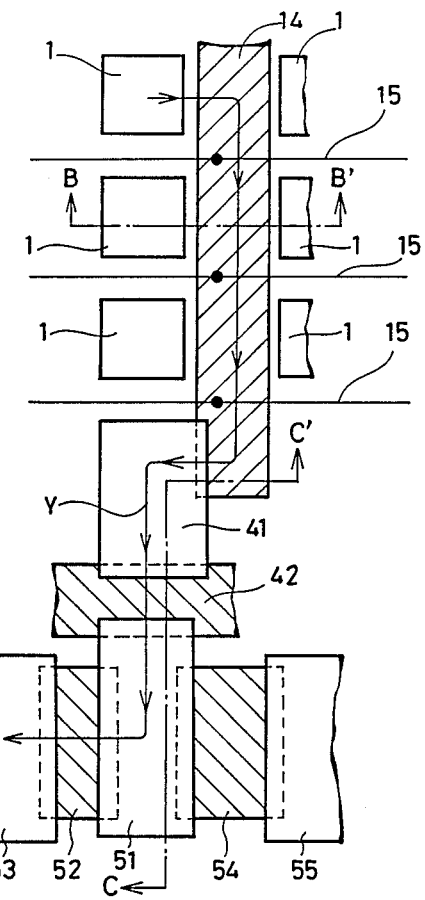
FIG. 4 is a plan view showing an array of a portion in an embodiment of the present invention.
Figure 5:
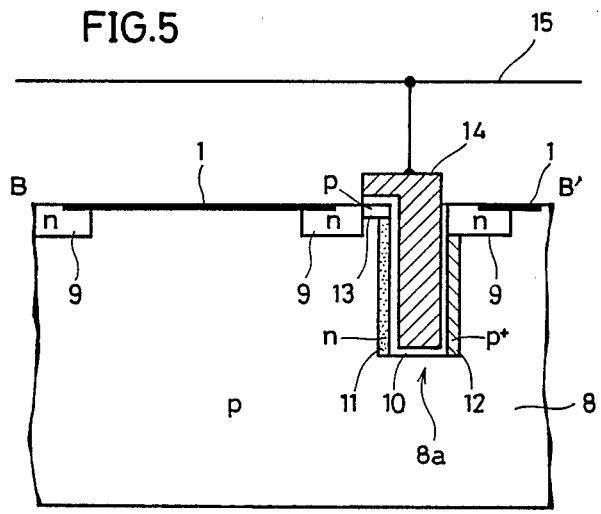
FIG. 5 is a sectional view taken along the line B–B' in FIG. 4.
Figure 6:
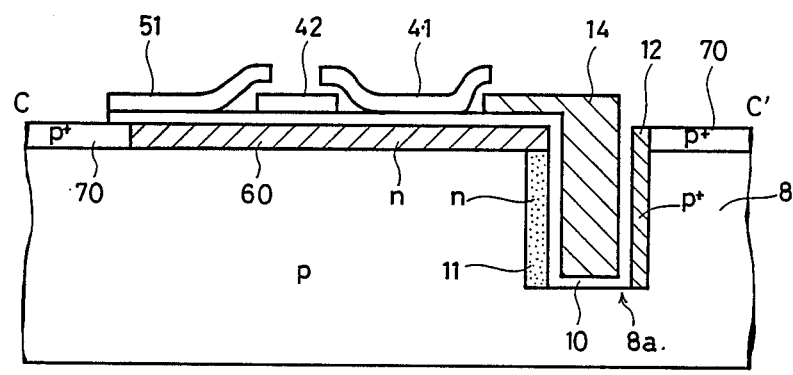
FIG. 6 is a sectional view taken along the line C–C' in FIG. 4.

Referring to FIGS. 4 to 6, an embodiment of the present invention will be described. FIG. 4 is a plan view showing an array of a portion of this embodiment and FIGS. 5 and 6 show sectional structures taken along the line B–B' and the line C–C' in FIG. 4, respectively.

Referring first to FIGS. 4 and 5, a structure of the characteristic portion of this embodiment will be described. Schottky barrier photo sensors 1 are formed in a matrix on a main surface of a semiconductor substrate 8 of a p type for example, in the same manner as in the case of FIG. 1. Each of the Schottky barrier photo sensors 1 is surrounded by an n type impurity region 9. The impurity region 9 is called a guard ring and serves to weaken an electric field effect around each Schottky barrier photo sensor 1, thereby to decrease leakage current. A groove 8a for forming a CSD channel is provided in a region between the adjacent guard rings 9 in the longitudinal direction (namely, in the vertical direction in FIG. 4). An n type impurity region 11 assigned for a buried channel of the CSD is formed on one side wall of the groove 8a. A p+ impurity region 12 for isolation of devices is formed on the other side wall of the groove 8a. Those impurity regions 11 and 12 are formed by ion implantation applied obliquely to the thus formed groove 8a in the semiconductor substrate 8. A p type impurity region 13 for determining threshold voltage of a transfer gate is formed on an edge portion of the groove 8a, namely, a portion contacting the buried channel impurity region 11 on the major surface of the semiconductor substrate 8. A gate electrode 14 is buried in the groove 8a. The gate electrode 14 faces the buried channel impurity region 11 and the isolation impurity region 12 through an insulating film 10. A top end of the gate electrode 14 is bent along the main surface of the semiconductor substrate 8 so as to cover the transfer gate impurity region 13. The gate electrode 14 also faces the transfer gate impurity region 13 through the insulating film 10. The gate electrode 14 serves as both of the transfer gate 2 and the vertical charge transfer element 3 in FIG. 1 and it is normally formed of polysilicon. A wire 15 for supplying a signal is connected to the gate electrode 14.

Further, as shown in FIG. 6, an n type impurity region 60 assigned for an interface portion and a buried channel of the horizontal CCD, and a p+ impurity region 70 for isolation of devices are formed on the semiconductor substrate 8. A storage gate 41, a storage control gate 42 and gate electrodes 51 to 55 are formed on the impurity region 60 through the insulating film 10. The gate electrodes 51 to 55 together with the impurity region 60 under those electrodes constitute the horizontal CCD. The storage gate 41 and the storage control gate 42 together with the impurity region 60 under those gates constitute the interface portion. The storage gate 41 stores temporarily the signal charge from the vertical charge transfer element and the storage control gate 42 controls transfer of the signal charge from the storage gate 41 to the horizontal CCD.

As is clearly understood from the above described structure, according to this embodiment, the vertical charge transfer elements are formed on the side walls of the respective related grooves 8a provided on the semiconductor substrate 8 and, consequently, the areas occupied by the vertical charge transfer elements are substantially zero on the plane pattern. Accordingly, the areas occupied by the Schottky barrier photo sensors 1 can be increased on the surface of the semiconductor substrate 8, whereby the fill factor can be improved. The Schottky barrier photo sensors 1 are operated in a wavelength range enabling photodetection by an internal photo-emissive effect so that electron-hole pairs can not be formed by an intrinsic mechanism in the semiconductor substrate. Thus, the charge can be prevented from flowing directly into the respective vertical charge transfer elements if light is applied to the semiconductor substrate.

Since each of the above described grooves 8a can be made as deep as several microns, each CSD channel width can be increased and the so-called narrow channel effect never occurs.

In addition, no problem is involved in patterning since a gate electrode 14 can be formed as a unitary portion over the whole area of one vertical charge transfer element in the same manner as in the conventional example.

Figure 2A:
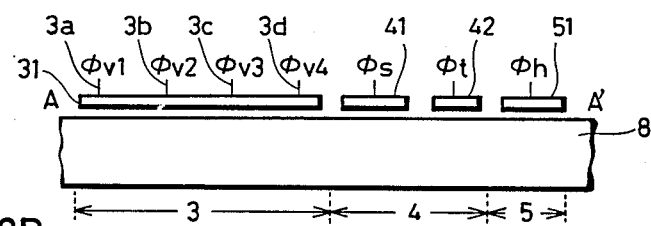
FIG. 2A is a view showing a sectional structure of a vertical charge transfer portion of the solid-state image sensor shown in FIG. 1.
Figure 2B:
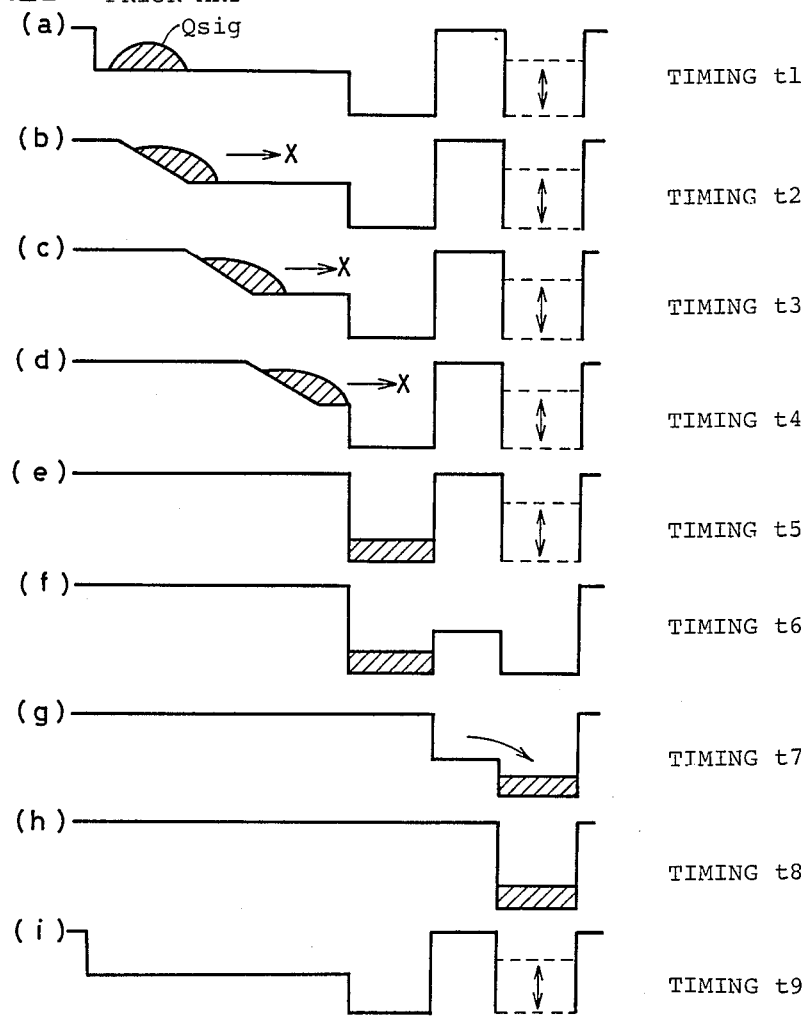
FIG. 2B shows changes of potential in the respective portions of the solid-state image sensor shown in FIG. 2A.
Figure 3:
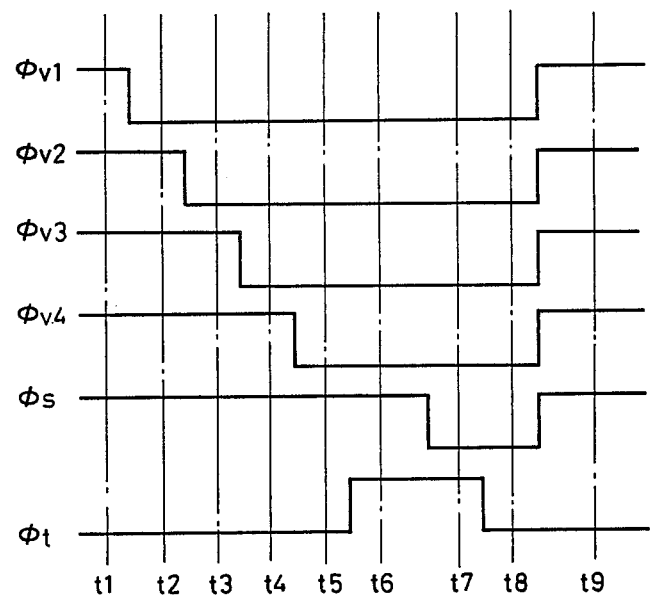
FIG. 3 is a timing chart showing clock pulses for operating the solid-state image sensor shown in FIG. 1.

Since operation of the above described embodiment is the same as in the conventional solid-state image sensor shown in FIGS. 1 to 3, description thereof is omitted. In FIG. 4, the arrows Y represent flow of the signal charge from a Schottky barrier photo sensor 1 to the horizontal CCD.

Although a vertical charge transfer element is formed only on one side wall of each groove 8a in the above described embodiment, vertical charge transfer elements may be formed on both side walls of each groove 8a with an isolation region being formed on the bottom of each groove. In such a case, the vertical charge transfer elements do not need to be arrayed between the respective adjacent columns of Schottky barrier photo sensors 1 and they may be arrayed at intervals of two columns for example.

Although the transfer gate impurity regions 13 are formed on the main surface of the semiconductor substrate 8 in the above described embodiment, each of the transfer gate impurity regions 13 may be formed on a side wall of each groove 8a. In such a case, the areas occupied by the gate electrodes 14 on the main surface of the semiconductor substrate 8 can be further decreased, causing the opening proportion to be further improved.

In addition, although the same gate electrode 14 is used as the electrode for the related transfer gate and a vertical charge transfer element in the above described embodiment, separate gate electrodes may be used as the electrode for the related transfer gate and a vertical charge transfer element.

Further, the respective portions of the embodiment may be of conductivity types opposite to the above described types.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid-state image sensor comprising: a plurarity of photo sensors (1) arrayed in a matrix on a main surface of a semiconductor substrate (8); a plurality of transfer gates (13) for reading out stored charge from said plurarity of photo sensors; and a plurality of vertical charge transfer elements (11) provided in association with the respective columns of said photo sensors for transferring said charge read out by said transfer gates in the direction of the respective columns of said photo sensors, each of said vertical charge transfer elements being formed on a side wall of a corresponding one of a plurality of grooves 8a provided on the main surface of said semiconductor substrate.

2. A solid-state image sensor comprising:
a plurality of Schottky barrier photo sensors (1) arrayed in a matrix on a main surface of a semiconductor substrate (8),
transfer gates (13) selected successively along each row of said Schottky barrier photo sensors for reading out charge stored in said Schottky barrier photo sensors for each row, and
a plurality of vertical charge transfer elements (11) provided in association with the respective columns of said Schottky barrier photo sensors, each of said vertical charge transfer elements being controlled by a single gate electrode (14), thereby to transfer, at least once in one horizontal scanning period, said charge read out by said transfer gates in the direction of the respective columns of said Schottky barrier photo sensors, each of said vertical charge transfer elements being formed on a side wall of a corresponding one of a plurality of grooves 8a provided on the main surface of said semiconductor substrate.

3. A solid-state image sensor in accordance with claim 2, wherein each of said grooves is provided between the respective adjacent columns of said Schottky barrier photo sensors, and each of said vertical charge transfer elements is formed on a side wall of said corresponding groove.

4. A solid-state image sensor in accordance with claim 2, wherein each of said grooves is provided in an intercolumn region of said Schottky barrier photo sensors at intervals of two columns thereof, and each of said vertical charge transfer elements is formed on both side walls of said corresponding groove.

5. A solid-state image sensor in accordance with claim 2, wherein said transfer gates are formed on the main surface of said semiconductor substrate.

6. A solid-state image sensor in accordance with claim 2, wherein each of said transfer gates is formed in any portion of the side wall of said corresponding groove.

* * * * *